(12) United States Patent
Oshima

(10) Patent No.: US 8,715,413 B2
(45) Date of Patent: May 6, 2014

(54) METHOD FOR MANUFACTURING A GROUP III NITRIDE SEMICONDUCTOR CRYSTAL AND METHOD FOR MANUFACTURING A GROUP III NITRIDE SEMICONDUCTOR SUBSTRATE

(75) Inventor: Yuichi Oshima, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 994 days.

(21) Appl. No.: 12/816,458

(22) Filed: Jun. 16, 2010

(65) Prior Publication Data

US 2011/0168082 A1 Jul. 14, 2011

(30) Foreign Application Priority Data

Jan. 13, 2010 (JP) .................................... 2010-4818

(51) Int. Cl.
*C30B 21/02* (2006.01)
(52) U.S. Cl.
USPC ............. 117/89; 117/101; 117/102; 117/103; 117/104
(58) Field of Classification Search
USPC ............................ 117/89, 101, 102, 103, 104
See application file for complete search history.

(56) References Cited

U.S. PATENT DOCUMENTS

| | | | | |
|---|---|---|---|---|
| 6,911,351 B2 * | 6/2005 | Kidoguchi et al. | ............ | 438/46 |
| 6,967,359 B2 * | 11/2005 | Kamiyama et al. | ........... | 257/190 |
| 2002/0117677 A1 | 8/2002 | Okuyama et al. | | |
| 2009/0286063 A2 * | 11/2009 | Dmitriev et al. | ............. | 428/220 |
| 2012/0112320 A1 * | 5/2012 | Kubo et al. | ................... | 257/615 |

FOREIGN PATENT DOCUMENTS

| | | |
|---|---|---|
| JP | 2002100805 A | 4/2002 |
| JP | 2002316892 | 10/2002 |
| JP | 2005247625 A | 9/2005 |
| JP | 2009298629 A | 12/2009 |

OTHER PUBLICATIONS

Akira Usui et al., Thick GaN Epitaxial Growth with Low Dislocation Density by Hydride Vapor Phase Epitaxy, Jpn. J. Appl. Phys., vol. 36 (1997), pp. L899-L902.
Kensaku Motoki et al., Preparation of Large Freestanding GaN Substrates by Hydride Vapor Phase Epitaxy Using GaAs as a Starting Substrate, Jpn. J. Appl. Phys. vol. 40 (2001), pp. L140-L143.
Shuichi Kubo et al., Bulk GaN Crystals Grown by HVPE, Fundamental Technology Laboratory, Research and Development, Mitsubishi Chemical Group Science and Technology research Center, Inc., pp. 132.
Office Action issued on Dec. 25, 2012 in corresponding Japanese Patent Application No. 2010-004818 (with English translation).
Office Action, drafting date of Feb. 21, 2013, in corresponding Japanese Patent Application No. 2008-310823 (with English translation).

* cited by examiner

*Primary Examiner* — Bob M Kunemund
(74) *Attorney, Agent, or Firm* — Fleit Gibbons Gutman Bongini & Bianco PL; Marty Fleit; Paul D. Bianco

(57) ABSTRACT

The invention provides a method for manufacturing a Group III nitride semiconductor crystal. The method includes the steps of preparing a seed crystal and performing a convex surface-growing step to grow the group III nitride semiconductor crystal. The growth surface of the group III nitride semiconductor crystal is constituted only by a plurality of surfaces not vertical to a growth direction and the group III nitride semiconductor crystal grows while forming a convex shape as a whole by the growth surface constituted of the plurality of surfaces. The invention also provides a method for manufacturing a group III nitride semiconductor substrate.

19 Claims, 5 Drawing Sheets

METHOD FOR MANUFACTURING A GROUP III NITRIDE SEMICONDUCTOR CRYSTAL AND METHOD FOR MANUFACTURING A GROUP III NITRIDE SEMICONDUCTOR SUBSTRATE

The present application is based on Japanese Patent Application No. 2010-004818, filed on Jan. 13, 2010, the entire contents of which are hereby incorporated by reference.

BACKGROUND OF THE INVENTION

1. Field of the Invention

The present invention relates to a manufacturing method of a group III nitride semiconductor crystal and a manufacturing method of a group III nitride semiconductor substrate.

2. Description of the Related Art

Group III nitride semiconductor such as gallium nitride (GaN), indium gallium nitride (InGaN), aluminium gallium nitride (AlGaN) attracts attention as materials for blue light emitting diode (LED) and laser diode (LD). Further, application and development of the group III nitride semiconductor to an element for an electronic device has been started, by utilizing the characteristic of excellent heat resistant property and environment resistant property.

In order to achieve high performance of the above-described device, it is important to reduce crystal defects in epitaxial layers. In recent years, a GaN substrate with high quality is developed by HVPE (Hydride Vapor Phase Epitaxy), which is being spread mainly for the purpose of use for laser diode directed to the next generation DVD.

As a reducing technique of a dislocation density of the GaN substrate, FIELO (Facet Initiated Epitaxial Lateral Overgrowth) is famous (for example, see document 1). In the FIELO, when GaN is grown while forming inclined facets, dislocation is bent by the facets, and therefore propagation of the dislocation in a growth direction can be inhibited. For example, document 2 discloses a dislocation reducing technique in which the principle of the FIELO is thoroughly used. This method of using the FIELO is a technique in which inclined facets are maintained and a thick film is grown on inclined facets, to thereby collect dislocations into a specific part and locally reduce the dislocations in the other part.

(Document 1) A. Usui, H. Sunakawa, A. Sakai and A. A. Yamaguchi: Jpn. J. Appl. Phys., 36 (1997), L899

(Document 2) K. Motoki, T, Okahisa, N. Matsumoto, M. Matsushima, H. Kimura, H. Kasai, K. Takemoto, K. Uematsu, T. Hirano, M. Nakayama, S. Nakahata, M. Ueno, D. Hara, Y. Kumagai, A. Koukitu and H. Seki: Jpn. J. Appl. Phys., 40 (2001), L140

However, the GaN substrate fabricated by the aforementioned conventional method leaves much to be improved. Above all, reduction of a manufacturing cost is a greatest problem to be solved. This is because a base substrate needs to be prepared for each GaN substrate, thus incurring high cost. In order to solve this problem, methods of causing high-rate growth of GaN, multiple wafers growth of GaN, and a bulk method of causing growth of a bulk ingot of thick GaN and cutting-out multiple wafers of GaN from the ingot at once, are examined. Above all, the bulk method is extremely promising, because a substrate having an arbitrary crystal plane excluding C-plane which is available at present, can be manufactured.

However, it is absolutely not easy to grow the ingot of GaN. Particularly, a problem of cracks is serious. When GaN crystal is grown thick, micro cracks are generated for some reason during growth, resulting in an extremely rough surface. GaN that grows on such a rough surface has extremely high defect density, and can not be put into practical use. Such a tendency is remarkable as a growth rate becomes higher. In a case of a relatively slow growth rate of about 100 µm/hour, the problem of the micro cracks is not remarkable so much, and actually, fabrication of the GaN ingot having no-crack, with diameter of 2 inches and thickness of about 5.8 mm, is reported (by Kubo, et. al. 2nd International Symposium on Growth of III-Nitrides (2008), Presentation No. I-Tu-5, "Bulk GaN crystals grown by HVPE"). However, a high growth rate exceeding about 100 µm/hour involves a great problem that cracks are generated. In the growth of a GaN ingot, GaN is grown extremely thick. Therefore, although the high growth rate is favorable from economic viewpoint, such a high-rate thick film growth is greatly problematic.

Further, the reduction of the dislocation density is also an important issue. The dislocation density of the GaN substrates available in the market at present is about $10^6$ $cm^{-2}$. The dislocation density needs to be further reduced, for further enhancing potential of nitride semiconductor devices. It is known that the dislocation density is reduced as GaN grows thick. The reduction of the dislocations by such a thick film growth of GaN is considered to be caused by attraction between dislocations of Burgers vectors of opposite signs, thereby generating gradual approach between them, and coalescing and vanishing of the dislocations. The reduction rate of the dislocation density by this mechanism becomes extremely slow, with the reduction of the dislocation density. The reason therefore is considered as follows. When the dislocation density is reduced, distance between the dislocations becomes large and the attraction between the dislocations is weakened.

Meanwhile, as another reduction method of the dislocation density, methods according to the aforementioned documents 1, 2 can be given. Although GaN having an area of a low dislocation density of about $10^4$ to $10^5$ $cm^{-2}$ is obtained, width of the low dislocation density area is about 0.5 mm and is small, between high dislocation density areas. Therefore, there is a problem that manufacture of devices need to be performed, with positions aligned precisely, and there is a limit in a size of the devices that can be manufactured.

BRIEF SUMMARY OF THE INVENTION

An object of the present invention is to provide a manufacturing method of a group III nitride semiconductor crystal and a manufacturing method of the group III nitride semiconductor substrate, capable of manufacturing a group III nitride semiconductor crystal having a uniform low dislocation density area over a wide range at a low cost.

According to an aspect of the present invention, a manufacturing method of a group III nitride semiconductor crystal is provided, comprising:

the step of preparing a seed crystal; and the convex surface growing step of growing the group III nitride semiconductor crystal, with a growth surface of the group III nitride semiconductor crystal constituted only by a plurality of surfaces not vertical to a growth direction, and the growth surface constituted of the plurality of surfaces formed into a convex shape as a whole.

According to other aspect of the present invention, a manufacturing method of a group III nitride semiconductor crystal is provided, comprising:

the step of preparing a seed crystal;

the convex surface growing step of growing the group III nitride semiconductor crystal, with a growth surface of the group III nitride semiconductor crystal constituted only by a plurality of surfaces not vertical to a growth direction, and the growth surface constituted of the plurality of surfaces formed into a convex shape as a whole; and the step of manufacturing a group III nitride semiconductor substrate by cutting the group III nitride semiconductor crystal obtained by the convex surface growing step.

DETAILED DESCRIPTION OF THE INVENTION

Figure 1A:
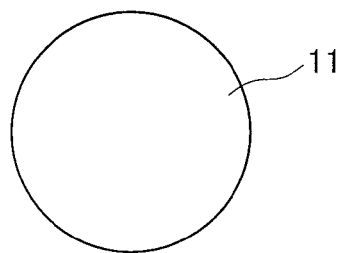
FIG. 1A to FIG. 1E are step views showing each manufacturing step of a manufacturing method of a GaN crystal and a manufacturing method of the GaN substrate according to an example of the present invention.

A manufacturing method of a group III nitride semiconductor crystal and a manufacturing method of the group III nitride semiconductor substrate according to an embodiment of the present invention will be explained hereafter. In the explanation hereafter, GaN will be described as a typical example of the group III nitride semiconductor.

As described above, a problem involved in growing ingot of GaN at high rate is the generation of cracks. As a result of meticulously observing GaN ingot in which the cracks are generated, it is found that even when the cracks are generated on c-plane ((0001) plane) with extremely high density in a poor surface state, absolutely no generation of the cracks is found in a side facet part which is spontaneously generated adjacent to the c-plane.

Namely, for example when ingot growth of GaN is carried out with a disc-shaped c-plane GaN substrate as a seed crystal, although depending on a growth condition, inclined side facets develop adjacent to the c-plane as the c-plane becomes thick (an area of the c-plane is reduced accordingly). When the growth rate is large, the cracks are easily generated on the c-plane. However, even when the cracks with extremely high density are generated, the side facets are in a completely good state actually in most cases. From this fact, an inventor of the present invention obtains an idea that when the crystal growth is carried out in a state of no c-plane on the surface of the ingot of GaN, no-crack state can be easily achieved even if high rate growth is carried out. When efficiency of obtaining the c-plane substrate is taken into consideration, it is a common sense that the crystal growth is devised so as to suppress reduction of the c-plane as much as possible. However, the present invention is based on precisely a revolutionary idea.

As a specific method of carrying out the crystal growth in a state of no c-plane, first, a method of growing GaN crystal thick, using a flat-shaped c-plane GaN substrate as a seed crystal, can be given. A growth condition is selected, under which the side facets are easily developed and the c-plane is rapidly reduced. However, when the diameter of the seed crystal substrate is large, extremely thick growth is required until the c-plane is vanished. Therefore, the crystal growth needs to be carried out at a low rate in the process of vanishing the c-plane, to avoid generation of the crack. However, in order to vanish the c-plane, ordinarily the GaN crystal needs to be grown up to the same thickness as the thickness of a radius of the seed crystal substrate, thus requiring much time in a case of a low-rate growth.

As a method of avoiding such a situation, it is effective to use a seed crystal substrate with prescribed diameter capable of vanishing the c-plane before the thickness reaches the thickness to cause the cracks to be generated. Alternatively, it is also effective to surround a side wall face of the seed crystal by planes as {10-12} planes. Specifically, for example, it is also effective to use the seed crystal substrate having a prescribed crystal surface as the side wall face, or use a mask having a prescribed shaped opening in such a manner as being superposed on the seed crystal substrate with a prescribed crystal orientation aligned, and carry out the crystal growth through the opening.

When the c-plane is vanished once, the ingot without cracks can be grown at a high rate thereafter. Accordingly, the GaN crystal can be efficiently manufactured at a low cost. The ingot can also be expanded and grown in a diameter direction (direction orthogonal to the c-axis direction) by devising a growth condition and a substrate holder holding the seed crystal substrate, as well as growing the crystal in the c-axis direction. After growth is ended, the ingot is sliced in a direction, etc, parallel to the c-plane to manufacture the GaN substrate. It is also effective to use a top part of the ingot itself, with the c-plane vanished and an overall growth surface in an appearance of a convex shape, as the seed crystal of the next ingot growth.

The manufacturing method of the group III nitride semiconductor crystal according to an embodiment of the present invention is an effective technique for obtaining GaN with low defect density. Namely, the dislocation is bent by growing the GaN crystal in a state that an overall growth surface of the ingot is formed by inclined facets inclined to the growth direction of the ingot, and therefore the dislocation density is reduced. A typical dislocation reducing method utilizing a bending effect of the dislocation due to facets is already described (documents 1 and 2). However, the problem of these conventional techniques is that the bent dislocations come together into valley (concave) portions, because valley portions of the facets always exist. Namely, a high dislocation density area and a low dislocation density area are formed, resulting in a micro density variation of the dislocations. In the manufacturing method of the group III nitride semiconductor crystal according to an embodiment of the present invention, the overall growth surface is formed into the convex shape, and therefore the bent dislocations come entirely together to the side face of the crystal, and do not come together into a specific place. Accordingly, the low dislocation density and uniformity of the dislocation density can be made highly compatible. Regarding a border between micro and macro, there is no general clear definition. However, the term "micro" is used here in the meaning of not more than a size of an optical microscope scale, such as a size of 1 mm or less. Meanwhile, the term "macro" is used in the meaning of a scale of 1 cm or more for describing a distribution over an entire surface of a wafer.

In the above description, GaN is described as the group III nitride semiconductor crystal. However, in addition to GaN, the present invention can also be applied to other group III nitride semiconductor such as AlN and AlGaN and a mixed crystal of them.

Further, the manufacturing method of the group III nitride semiconductor crystal and the manufacturing method of the group III nitride semiconductor substrate according to another embodiment of the present invention will be described.

The manufacturing method of the group III nitride semiconductor crystal according to this embodiment comprises:
the step of preparing a seed crystal; and
the convex surface growing step of growing the group III nitride semiconductor crystal, with a growth surface of the group III nitride semiconductor crystal constituted only by a plurality of surfaces not vertical to a growth direction, and the growth surface constituted of the plurality of surfaces formed into a convex shape as a whole.

Owing to the convex surface growth in which an overall growth surface of the group III nitride semiconductor crystal grows in an appearance of the convex surface shape, the group III nitride semiconductor crystal without generation of cracks and having a uniform low dislocation density area over a wide range can be manufactured. Further, high-rate growth can be realized, and therefore the group III nitride semiconductor crystal can be manufactured at a low cost.

The growth is preferably carried out so as not to form a concave shaped portion within the growth surface having a convex surface shape composed of the plurality of surfaces, to prevent a state that the dislocations bent by the growth surface in the convex surface shape, come together into the concave shaped portions and the high dislocation density area is generated.

Preferably, the growth direction of the group III nitride semiconductor crystal is set as the C-axis direction, and all of the plurality of surfaces are set as planes other than the c-plane.

Preferably, six equivalent {10-1m} planes (wherein m is the natural number) are included in the plurality of surfaces other than the c-plane. Particularly, m=1, 2, 3 are preferable. Namely, preferably any one of the six equivalent {10-11} planes, six equivalent {10-12} planes, and six equivalent {10-13} planes are included.

Further, preferably the plurality of planes other than the C-plane include 6 equivalent {1-12n} planes (wherein n is the natural number). Particularly, n=1, 2, 3 is preferable.

Also, preferably the plurality of planes other than the C-plane are constituted of 12 planes of 6 equivalent {10-1m} planes (wherein m is the natural number), and 6 equivalent {1-12n} planes (wherein n is the natural number) in total. Particularly, m is preferably any one of 1, 2, 3, and n is preferably any one of 1, 2, 3.

Note that, the growth direction of the group III nitride semiconductor crystal is not limited to the C-axis, and M-axis or A-axis, etc, can be arbitrarily selected.

From the viewpoint of productivity, the diameter (size in a direction vertical to the growth direction) of the group III nitride semiconductor crystal that grows in the convex surface growing step is set to 10 mm or more, and the growth rate of the group III nitride semiconductor crystal in the convex surface growing step is set to 300 μm/hour or more. Owing to the convex surface growth, high rate growth of 300 μm/hour or more is achieved without generating the cracks. The diameter of the group III nitride semiconductor crystal that grows in the convex surface growing step is preferably set to 25 mm or more and further preferably set to 40 mm or more. Further, the growth rate of the group III nitride semiconductor crystal in the convex surface growing step is set to 500 μm/hour or more and further preferably set to 1000 μm/hour or more.

When the seed crystal substrate is used as the seed crystal, a growth surface inclined to a main surface of the seed crystal substrate is formed in an outer peripheral part of the group III nitride semiconductor crystal that grows on the main surface of the seed crystal substrate, then the inclined growth surface is grown so as to expand to the center side of the seed crystal substrate, to thereby carry out flat surface vanishing growth for vanishing a flat surface of the group III nitride semiconductor crystal which is parallel to the main surface of the seed crystal substrate and exists at the center side of the group III nitride semiconductor crystal. Thus, the growth surface in appearance of the convex surface shape composed of only the inclined growth surface is formed. The group III nitride semiconductor crystal is grown on the growth surface in the convex surface shape.

The seed crystal substrate, with the side wall surfaces inclined to the main surface, may be preferably used, as the seed crystal substrate. When the main surface of the seed crystal substrate is the c-plane and the group III nitride semiconductor crystal is grown in the C-axis direction, six equivalent {10-1m} planes (m is the natural number, and particularly any one of m=1, 2, 3 is preferable), or six equivalent {1-12n} planes (n is the natural number and particularly any one of n=1, 2, 3 is preferable) are preferably used, as the side wall surfaces inclined to the main surface.

Further, flat surface vanishing growth may be carried out by superposing the mask having a polygonal opening on the main surface, being the growth surface of the seed crystal substrate, so that each side of the polygonal opening coincides with a prescribed crystal orientation of the main surface, and by growing the group III nitride semiconductor crystal on the main surface of the opening part. For example, when each side of a regular hexagon coincides with <11-20>, the {10-1m} planes are grown on the outer periphery of the grown crystal, or when each side of the regular hexagon coincides with <10-10>, {11-2n} planes are grown, by using the mask having the regular hexagonal opening.

In the flat surface vanishing growing step, preferably the group III nitride semiconductor crystal carries out low rate crystal growth wherein the cracks are not generated in the group III nitride semiconductor crystal during growth, and in the convex surface growing step, the group III nitride semiconductor crystal carries out high rate crystal growth of 300 μm/hour or more. HVPE (Hydride Vapor Phase Epitaxy) is preferably used in the crystal growth of the group III nitride semiconductor and particularly in the high rate crystal growth of 300 μm/hour or more.

The convex surface growth is preferably carried out, by using the top part including the growth surface part having the convex surface shape obtained by cutting the group III nitride semiconductor crystal having the growth surface in appearance of the convex surface shape, as the seed crystal. In this case, the top part including the growth surface part having the convex surface shape can be reused, and the flat surface vanishing growth can be omitted.

The group III nitride semiconductor substrate (wafer) can be obtained by cutting the group III nitride semiconductor crystal (ingot) manufactured by the manufacturing method of the group III nitride semiconductor crystal.

A plurality of wafers of group III nitride semiconductor wafers are obtained at once from the ingot of the group III nitride semiconductor crystal. Further, since the ingot can be obtained, the wafer having an arbitrary crystal plane other than a plane vertical to the growth direction of the group III nitride semiconductor crystal (for example, c-plane) can be manufactured.

EXAMPLES

Next, specific examples of the present invention will be described.

Example 1

Figure 1B:
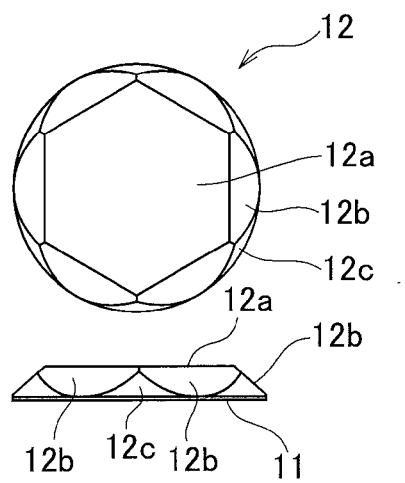
Figure 1C:
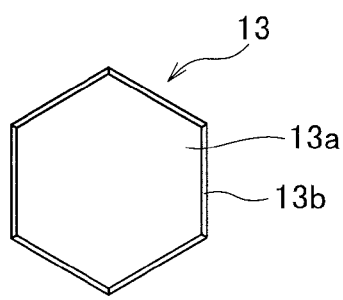
Figure 1D:
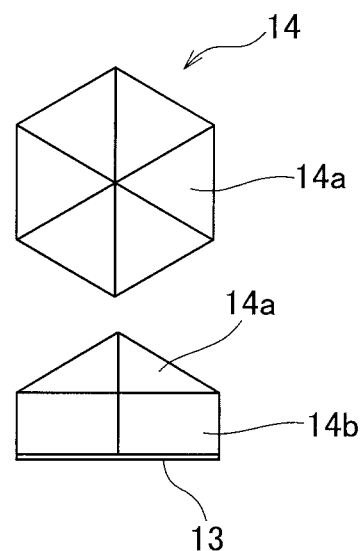
Figure 1E:
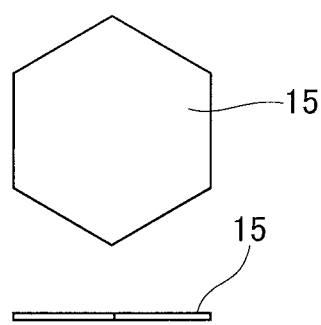

The manufacturing method of the GaN crystal and the manufacturing method of the GaN substrate according to example 1 of the present invention will be described, by using FIG. 1A to FIG. 1E. FIG. 1A to FIG. 1E are step views showing each manufacturing step, and FIG. 1A and FIG. 1C are plan views (upper side views), and upper parts of FIG. 1B, FIG. 1D, and FIG. 1E are plan views (upper side views) and lower parts thereof are side views.

First, as the seed crystal, a disc-shaped c-plane GaN substrate 11 with diameter of 2 inches and thickness of 430 μm was prepared (FIG. 1A). The dislocation density of the GaN substrate 11 was measured by CL (Cathodo-luminescence). An observation view was set to 1 mm×1 mm. An average dislocation density in the surface of the GaN substrate 11 was $5 \times 10^6$ cm$^{-2}$, and excellent uniformity was exhibited in the observed scale, and in-surface dislocation distribution was approximately uniform.

The GaN substrate 11 was set in the substrate holder in a HVPE furnace, and GaN crystal (GaN ingot) 12 was homoepitaxially-grown on Ga polar plane of the GaN substrate 11, as the group III nitride semiconductor crystal. GaCl and NH$_3$ were used as raw materials. Mixed gas of H$_2$ and N$_2$ was used as carrier gas. Partial pressures of GaCl and NH$_3$ in the HVPE furnace were respectively set to 0.3 kPa and 16 kPa. The growth temperature was set to 1050° C. The growth was carried out under approximately an atmospheric pressure. At this time, the growth rate in the C-axis direction was 150 μm/hour.

The shape of the GaN ingot 12 at an initial time of growth was formed into approximately a frustum of circular cone as a whole, and upper surface 12a of the GaN ingot 12 was the c-plane and the side face of the GaN ingot 12 was formed into an inclined surface formed by flat surface parts 12b and conical surface parts 12c. The flat surface parts 12b were {10-11} planes, and appear at six places every other 60 degrees along the inclined circular cone shaped side face. Namely, the GaN ingot 12 has a shape that the frustum of circular cone shaped side face (conical surface) is cut by flat planes ({10-11} planes) at six places. Note that although the conical surface parts 12c look like conical surfaces by naked eyes, when observed in a state of expansion under a microscope, the conical surface parts 12c are formed into jagged surfaces, with {10-11} planes and {11-12} planes finely alternately arranged.

In the inclined side face, the flat surface parts 12b composed of {10-11} planes are gradually developed and expanded, and when a thickest part of the GaN ingot 12 reaches about 5 mm, the conical surface parts 12c are not brought into contact with the outer periphery of the upper surface 12a, and only the flat surface parts 12b are brought into contact with the outer periphery of the upper surface 12a. Thus, the shape of the upper surface 12a formed by the c-plane was formed into a hexagonal shape. The growth was continued as it was, and when the thickest part of the ingot 12 reaches about 6 mm, the growth was stopped (FIG. 1B).

When a sample was taken out from the HVPE furnace, the ingot 12 was formed, with the hexagonal c-plane as the main surface (upper surface 12a). The cracks were not generated. The ingot 12 was cut at a position of about 1 mm from an outermost surface (upper surface 12a), to thereby cut-out hexagonal c-plane GaN substrate 13 with a thickness of about 1 mm (FIG. 1C). The GaN substrate 13 has an upper surface 13a as the c-plane, and six side surfaces 13b as {10-11} planes.

The hexagonal GaN substrate 13 was set in the HVPE furnace again as the seed crystal, to thereby carry out the homoepitaxial growth of GaN ingot 14 on the GaN substrate 13. Partial pressures of GaCl and NH$_3$ were set to 0.7 kPa and 16 kPa, respectively. Further, the growth temperature was set to 1010° C. At this time, the growth rate in the C-axis direction was about 330 μm/hour. When the growth was continued under this condition, side faces of six {10-13} planes adjacent to the c-plane of the upper surface of the GaN ingot 14 are developed, and the c-plane became gradually smaller in a state of the hexagonal shape, to thereby form a frustum of six-sided pyramid top part (not shown). Further, a straight trunk part 14b having a six-sided prism shape composed of vertical six {10-10} planes adjacent to the side faces of the {10-13} planes, appears in a lower part of the frustum of six-sided pyramid top part. The c-plane was completely vanished when the thickest part of the GaN ingot 14 reached about 19 mm, and top part 14a in a six-sided pyramid shape was formed. The top part in a six-sided pyramid shape becomes the growth surface in appearance of the convex surface shape in the convex surface growing step of this example. The growth was further continued, and was stopped when the thickest part reached 25 mm (FIG. 1D).

When the sample was taken out from the HVPE furnace, it was found that the ingot 14 was formed by the top part 14a in a six-sided pyramid shape composed of {10-13} planes, and the straight trunk part 14b in a six-sided prism shape composed of {10-10} planes in the lower part of the top part 14a. The cracks were not generated. The straight trunk part 14b of the ingot 14 was sliced in parallel to the c-plane, to thereby cut-out a plurality of GaN wafer blanks. Both sides of these GaN wafer blanks were polished, to thereby obtain a hexagonal c-plane GaN substrate 15 with a thickness of 430 μm and a diameter of about 46 mm (a diagonal length, being a diameter of a circumscribing circle in a regular hexagon) (FIG. 1E). No processing was applied to the top part 14a of the ingot 14, which was then used as the seed crystal in example 2 as will be described later.

Distribution of the dislocation density was examined by a CL method, for the obtained GaN substrate 15 cut-out from the vicinity of an upper end of the straight trunk part 14b. An observation view was set to 1 mm×1 mm, and a plurality of places were photographed. As a result, it was found that an excellent value of about $1 \times 10^6$ cm$^{-2}$ was obtained in a part within 20 mm from the center of the GaN substrate 15. In addition, further excellent value of about $5 \times 10^5$ cm$^{-2}$ was obtained in its outer peripheral part. Either area of them has excellent uniformity within the observed scale. The dislocation density of the outer peripheral part is lower than the dislocation density in the vicinity of the center and the reason therefore is considered as follows. The outer peripheral part is grown with inclined facets ({10-13} planes), and therefore dislocations are bent at this part to thereby suppress propagation of the dislocations in the C-axis direction.

Example 2

Figure 2A:
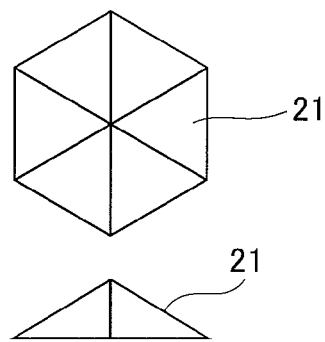
FIG. 2A to FIG. 2C are step views showing each manufacturing step of a manufacturing method of a GaN crystal and a manufacturing method of the GaN substrate according to an example of the present invention.
Figure 2B:
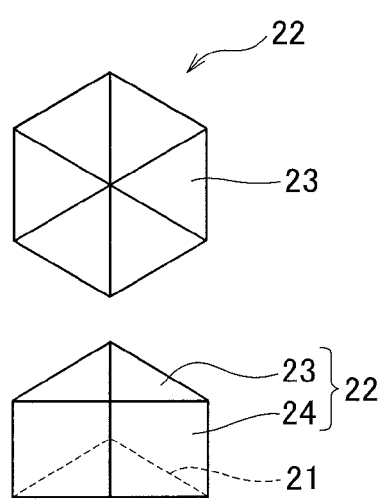
Figure 2C:
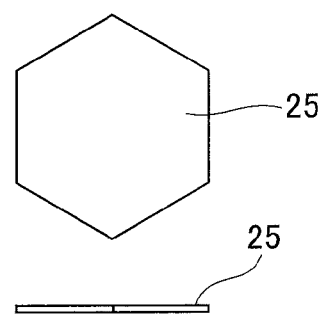

Example 2 of the present invention will be described by using FIG. 2A to FIG. 2C. FIG. 2A to FIG. 2C are step views showing each manufacturing step of the GaN crystal and the GaN substrate, and in each of FIG. 2A to FIG. 2C, the upper part is a plan view (upper side view), and the lower part is a side view.

The six-sided pyramid shaped top part of the {10-13} planes remained in the example 1 was used as seed crystal 21 of the example 2 (FIG. 2A). The six-sided pyramid shaped seed crystal 21 was set in the HVPE furnace, and the homoepitaxial growth of the GaN ingot 22 was carried out on the seed crystal 21. The partial pressures of GaCl and NH$_3$ were set to 2.5 kPa and 49 kPa respectively. Further, the growth temperature was set to 1010° C. At this time, the growth rate in the C-axis direction was about 1200 μm/hour. During growth, the top part 23 composed of {10-13} planes of the ingot 22 maintained the six-sided pyramid shape of top part 23 composed of {10-13} planes of the ingot 22 as it was, then a six-sided prism shaped straight trunk part 24 composed of {10-10} planes was formed in the lower part of the top part 23, and a length of this straight trunk part 24 was gradually increased. When the length of the straight trunk part 24 reached 12 mm, the growth was stopped and the grown ingot 22 was taken out from the growth furnace (FIG. 2B).

The straight trunk part 24 of the taken out ingot 22 was sliced in parallel to the c-plane, to thereby obtain a plurality of wafer blanks. Both sides of these GaN wafer blanks were polished, to thereby obtain a hexagonal c-plane GaN substrate 25 with a thickness of 430 μm and a diameter (diagonal length) of about 46 mm (FIG. 2C).

The distribution of the dislocation density was examined by the CL method, for the obtained GaN substrate 25 cut-out from the vicinity of the upper end of the straight trunk part 24. An observation view was set to 1 mm×1 mm, and a plurality of places were photographed. An average dislocation density in the surface of the GaN substrate 25 was 1×10$^5$ cm$^{-2}$, and excellent uniformity was shown within the observed scale, and in-surface dislocation distribution was approximately uniform. Macro uniformity of the dislocation density was further improved in the example 2 compared with the example 1, and the reason therefore is considered as follows. Namely, the ingot 22 was formed thick with the growth of the convex surface, and therefore a part, being a low-dislocation part due to inclined facets, expands to the center of the straight trunk part 24.

Comparative Example 1

Figure 3A:
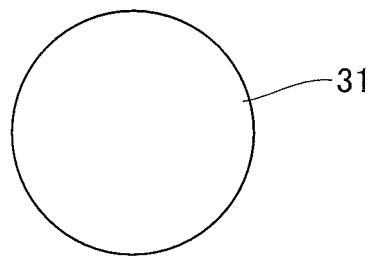
FIG. 3A and FIG. 3B are step views showing each manufacturing step of the manufacturing method of the GaN crystal according to a comparative example.
Figure 3B:
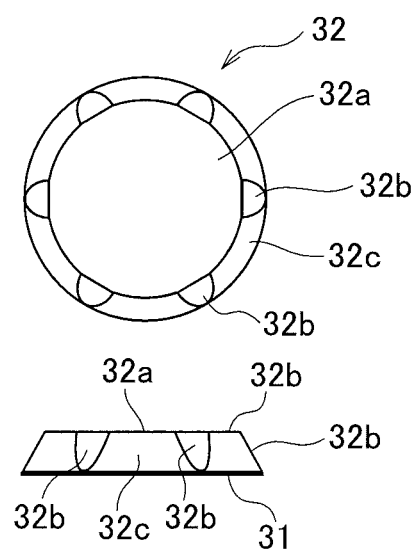

Comparative example 1 to be compared with the aforementioned examples will be described by using FIG. 3A and FIG. 3B. FIG. 3A and FIG. 3B are step views showing each manufacturing step of the GaN crystal, and FIG. 3A is a plan view (upper side view), the upper part of FIG. 3B is a plan view (upper side view), and the lower part of FIG. 3B is a side view.

First, a disc-shaped c-plane GaN substrate 31 with a diameter of 2 inches and a thickness of 430 μm, which was the same as that of the example 1, was prepared (FIG. 3A). The GaN substrate 31 was set in the HVPE furnace, and GaN was homoepitaxially-grown on the Ga polar plane of the GaN substrate 31. GaCl and NH$_3$ were used as raw materials. The partial pressures of GaCl and NH$_3$ were set to 2.5 kPa and 49 kPa respectively, in the same way as the example 2. The growth temperature was set to 1010° C. The growth was carried out under approximately the atmospheric pressure. At this time, the growth rate in the C-axis direction was about 1200 μm/hour. Ingot 32 with a thickness of about 12 mm could be obtained after growth of 10 hours (FIG. 3B).

Upper surface 32a of the ingot 32 was a flat c-plane, and its periphery was formed into basically a conical surface state, and flat surface parts 32b were formed at six places of the conical surface shaped side face in such a manner as being chipped off by {10-11} planes. A lateral sectional shape of the ingot 32 in the frustum of circular cone was gradually close to a hexagonal form. Numerous micro cracks were generated, with a part adjacent to the conical surface part 32c in a conical surface state as origins of the cracks. The micro cracks were generated during growth, and GaN was further grown thereon, and therefore roughness of the surface was extremely great.

Comparative Example 2

Comparative example 2 to be compared with the aforementioned examples will be described by using FIG. 4A to FIG. 4G. FIG. 4A to FIG. 4G are cross-sectional views showing each manufacturing step of the GaN crystal and the GaN substrate.

Figure 4A:
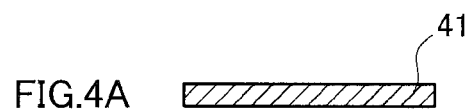
FIG. 4A to FIG. 4G are step views showing each manufacturing step of a manufacturing method of the GaN crystal and a manufacturing method of the GaN substrate according to a comparative example.
Figure 4B:
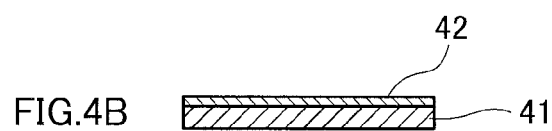
Figure 4C:
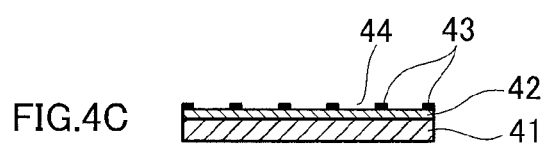

First, a c-plane sapphire substrate 41 with a diameter of 2 inches was prepared (FIG. 4A). GaN thin film 42 with a thickness of 1 μm was grown on the sapphire substrate 41 by using MOVPE (metal-organic vapor phase epitaxy), to thereby obtain a GaN template (FIG. 4B). Stripe masks 43 of Pt (platinum) were formed on the GaN template by using photolithography (FIG. 4C). The thickness of each stripe mask 43 was set to 100 nm and the width thereof was set to 1 μm. Interval between masks 43 was set to 500 μm, and a direction of stripes was set to <11-20>.

Figure 4D:
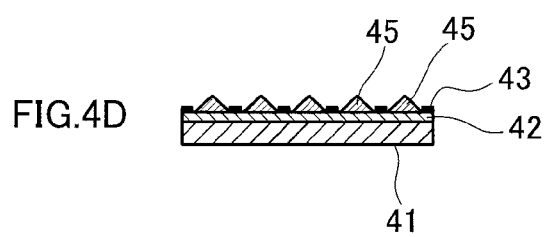

The template with masks was set in the HVPE furnace, and the growth of GaN was carried out. GaCl and NH$_3$ were used as raw materials. The partial pressures of GaCl and NH$_3$ were set to 2.5 kPa and 49 kPa respectively. The growth temperature was set to 1080° C. The growth was carried out approximately under the atmospheric pressure. At this time, the growth rate in the C-axis direction was about 1000 μm/hour. The growth of GaN starts from mask opening part 44 and first, GaN 45 with a mountain-shaped triangular sectional face was formed with two planes of {10-11} planes intersected (FIG. 4D).

Figure 4E:
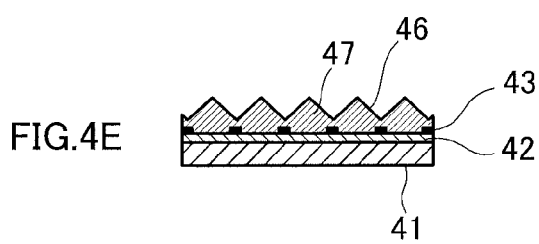

When the growth was continued, triangular sectional GaN 45 generated in the neighboring mask opening parts 44 were collided with each other on the masks 43, then valleys of the GaN ingots 47 were formed in collision parts of the GaN 45 on the masks 43, and surface 46 was formed, having about 500 μm cyclic triangle wave shaped irregularities as a whole (FIG. 4E).

Figure 4F:
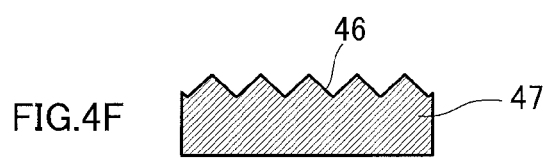

Thereafter even if the growth was further continued, the surface 46 was not flattened and a film of the GaN ingot 47 became thicker while keeping an original triangle wave shape. When the thickest part of the GaN ingot 47 reached about 10 mm, the growth was stopped and the grown GaN ingot 47 was taken out from the furnace (FIG. 4F). The GaN ingot 47 had a higher rigidity than that of the sapphire substrate 41, and therefore the sapphire substrate 41 was cracked and the GaN ingot 47 was naturally separated from the sapphire substrate 41 during decrease of temperature after end of the growth.

Figure 4G:

The straight trunk part of the taken out ingot 47 was sliced in parallel to the c-plane, to thereby obtain a plurality of wafer blanks. Both sides of these GaN wafer blanks were polished, to thereby obtain the c-plane GaN substrate 48 with a thickness of 430 μm (FIG. 4G).

The distribution of the dislocation density was examined by CL method, for the obtained GaN substrate 48 cut-out from the uppermost part of the ingot 47. The observation view was set to 1 mm×1 mm, and a plurality of places were photographed. The distribution of the dislocations was approximately uniform in a macro scale. However, about 500 μm cyclic variation of the dislocation density was shown in a micro scale. Namely, excellent dislocation density of 3×10$^5$ cm$^{-2}$ was obtained in the parts, being projection portions (mountain portions) during growth. However, dislocations come together into the parts, being valleys, and a high dislocation density area of 1×10$^8$ cm$^{-2}$ or more was formed.

In the aforementioned examples, only the GaN ingot grown by HVPE method has been described. However, it is obvious that other growth methods such as a flux method or an ammonothermal method is also effective. Further, the present invention can also be applied to other group III nitride semiconductors such as AlN and a mixed crystal of them, in addition to GaN. In the aforementioned examples, the growth direction of the ingot was set only in the C-axis direction, and a slice plane was set only in the direction parallel to the c-plane. However, the growth direction and the slice plane can be arbitrarily selected to be M-axis and M-plane, or the like.

What is claimed is:

1. A method for manufacturing a group III nitride semiconductor crystal, the method comprising the steps of:
    preparing a seed crystal; and
    performing a convex surface-growing step including growing the group III nitride semiconductor crystal, wherein a growth surface of the group III nitride semiconductor crystal is constituted only by a plurality of surfaces not vertical to a growth direction, and wherein the group III nitride semiconductor crystal grows while forming a convex shape as a whole by the growth surface constituted of the plurality of surfaces.

2. The method for manufacturing a group III nitride semiconductor crystal according to claim 1, wherein growth is progressed such that concave-shaped portions are not formed in the growth surface composed of the plurality of surfaces.

3. The method for manufacturing a group III nitride semiconductor crystal according to claim 1, wherein the growth direction is set in a C-axis direction, and each of the plurality of surfaces is a plane excluding a c-plane.

4. The method for manufacturing a group III nitride semiconductor crystal according to claim 1, wherein each of the plurality of surfaces is a plane excluding a c-plane and the plurality of surfaces includes six equivalent (10-1m) planes, in which m is a natural number.

5. The method for manufacturing a group III nitride semiconductor crystal according to claim 3, wherein the plurality of surfaces includes six equivalent (1-12n) planes, in which n is a natural number.

6. The method for manufacturing a group III nitride semiconductor crystal according to claim 3, wherein the plurality of surfaces includes a total of twelve planes, wherein six of the twelve planes are six equivalent (10-1m) planes, in which m is a natural number and six of the twelve planes are six equivalent (1-12n) planes, in which n is a natural number.

7. The method for manufacturing a group III nitride semiconductor crystal according to claim 1, wherein in the convex surface-growing step the seed crystal is obtained by cutting a top part of the group III nitride semiconductor, the top part having the convex shape.

8. The method for manufacturing a group III nitride semiconductor crystal according to claim 1, wherein a diameter of the group III nitride semiconductor crystal that grows by performing the convex surface-growing step is 10 mm or more.

9. The method for manufacturing a group III nitride semiconductor crystal according to claim 1, wherein growth of the group III nitride semiconductor crystal during the convex surface-growing step is 300 μm/hour or more.

10. The method for manufacturing a group III nitride semiconductor crystal according to claim 1, wherein the group III nitride semiconductor crystal is gallium nitride (GaN).

11. The method for manufacturing a group III nitride semiconductor crystal according to claim 1, further comprising a flat surface-vanishing growth step performed prior to the convex surface-growing step, the flat surface-vanishing growth step including:
    forming a growth surface inclined to a main surface of a seed crystal substrate, in an outer peripheral part of a group III nitride semiconductor crystal that grows on the main surface of a seed crystal substrate, by using the seed crystal substrate as a seed crystal, then growing the inclined growth surface so as to expand to a center side of the seed crystal substrate, and vanishing a flat surface of the group III nitride semiconductor crystal which is parallel to the main surface of the seed crystal substrate and exists at the center side of the seed crystal substrate,
    wherein after the flat surface-vanishing growth step is performed, the convex surface-growing step is performed, in which the group III nitride semiconductor crystal is grown on a growth surface having a convex surface shape composed of only the inclined growth surface.

12. The method for manufacturing a group III nitride semiconductor crystal according to claim 11, wherein a seed crystal substrate having a side wall surface inclined to the main surface is used as the seed crystal substrate.

13. The method for manufacturing a group III nitride semiconductor crystal according to claim 11, wherein a mask having an opening is superposed on the main surface, the main surface being the growth surface of the seed crystal substrate, such that the opening is aligned in a prescribed crystal orientation of the main surface, and the flat surface-vanishing growth step is performed by growing the group III nitride semiconductor crystal on the main surface of an opening part.

14. The method for manufacturing a group III nitride semiconductor crystal according to claim 11, wherein in the flat surface-vanishing growth step, crystal growth is carried out at a low growth rate so as not to generate a crack in the group III nitride semiconductor crystal during growth, and in the convex surface-growing step, crystal growth is carried out at a high growth rate of 300 μm/h or more.

15. A method for manufacturing a group III nitride semiconductor substrate, the method comprising the steps of:
    preparing a seed crystal;
    performing a convex surface-growing step including growing the group III nitride semiconductor crystal, wherein a growth surface of the group III nitride semiconductor crystal is constituted only by a plurality of surfaces not vertical to a growth direction and wherein the group III nitride semiconductor crystal grows while forming a convex shape as a whole by the growth surface constituted by the plurality of surfaces; and
    manufacturing a group III nitride semiconductor substrate by cutting the group III nitride semiconductor crystal obtained by performing the convex surface-growing step.

16. The method for manufacturing a group III nitride semiconductor substrate according to claim 15, wherein the group III nitride semiconductor substrate is a gallium nitride (GaN) substrate.

17. The method for manufacturing a group III nitride semiconductor crystal according to claim 1, further comprising preparing a seed crystal substrate as the seed crystal and growing the group III nitride semiconductor crystal such that one convex shape is formed on the seed crystal substrate as a whole.

18. The method for manufacturing a group III nitride semiconductor crystal according to claim 1, wherein when growing the group III nitride semiconductor crystal a surface vertical to the growth direction is not formed.

19. The method for manufacturing a group III nitride semiconductor crystal according to claim 11, wherein when growing the group III nitride semiconductor crystal a surface vertical to the growth direction is not formed.

* * * * *